United States Patent [19]

Hahn et al.

[11] Patent Number: 5,323,408
[45] Date of Patent: Jun. 21, 1994

[54] REGULATION OF PRECONDUCTION CURRENT OF A LASER DIODE USING THE THIRD DERIVATIVE OF THE OUTPUT SIGNAL

[75] Inventors: Alois Hahn; Markus Hiebexler; Richard Hirn, all of Vienna; Franz Lauritsch, Graz, Austria

[73] Assignee: Alcatel N.V., Amsterdam, Netherlands

[21] Appl. No.: 94,841

[22] Filed: Jul. 20, 1993

[30] Foreign Application Priority Data

Jul. 21, 1992 [AT] Austria ............... 1492/92

[51] Int. Cl.$^5$ ............................ H01S 3/133
[52] U.S. Cl. ........................ 372/29; 372/33; 372/38
[58] Field of Search ............ 372/26, 29, 33, 38; 359/187

[56] References Cited

U.S. PATENT DOCUMENTS

| | | |
|---|---|---|
| 898,702 | 6/1992 | Slawson . |
| 4,344,173 | 8/1982 | Straus ............... 372/38 |
| 4,612,671 | 9/1986 | Giles ............... 372/38 |
| 4,680,810 | 7/1987 | Swartz ............... 455/609 |
| 5,027,362 | 6/1991 | Hokanson et al. ....... 372/29 |
| 5,062,114 | 10/1991 | Ito .................. 372/31 |

FOREIGN PATENT DOCUMENTS 4024317  2/1991  Fed. Rep. of Germany .

OTHER PUBLICATIONS

"Optische Sender mit Halbleiterlasern fur hohe Bitraten", P. Marten, Elektronik 22/5.11.82, pp. 89–94.

*Primary Examiner*—Rodney B. Bovernick
*Assistant Examiner*—Robert McNutt
*Attorney, Agent, or Firm*—Ware, Fressola, Van Der Sluys & Adolphson

[57] ABSTRACT

A process for controlling the preconduction current of a laser diode that operates in conjunction with a monitor diode in a control circuit with operational amplifiers, comprising signal processing filters, an electric supply unit such as, e.g., a power source, and a zero crossing detector, where the laser diode (5a) is driven by a linear current ramp signal provided by the supply unit, that the output signal (16) of the monitor diode (15) is differentiated three times, and that, when a zero crossing of the triple-differentiated monitor diode output signal (16) is detected, an optimum current of the current ramp signal is retained by the action of the zero passage detector.

9 Claims, 3 Drawing Sheets

REGULATION OF PRECONDUCTION CURRENT OF A LASER DIODE USING THE THIRD DERIVATIVE OF THE OUTPUT SIGNAL

TECHNICAL FIELD

The invention concerns a process for controlling the preconduction current of a laser diode, which operates in conjunction with a monitor diode in a control system with operational amplifiers, comprising signal processing filters, an electric power supply unit, such as, e.g., a current power source, and a zero crossover detector, as well as an installation to perform this process, with an adder for superimposing the preconduction current and a modulation current, and a controllable power source that supplies the preconduction current, as well as an evaluation circuit that is connected to the monitor diode.

BACKGROUND OF THE INVENTION

The use of semiconductor lasers in optical communication systems has proven to be advantageous, particularly because of the ability to modulate higher frequencies, and low-loss signal transmissions over large transmission lengths without intermediate amplifiers.

To enable the semiconductor laser to modulate quickly, it must be supplied with a preconduction current, which is slightly above the threshold current, during the data transmission. The modulation current is then added to this preconduction current. However, any fluctuations of the threshold current caused by aging or temperature variations must be compensated by a control circuit.

The actual threshold current is usually acquired by sampling the current-voltage process of the laser diode, whose magnitude serves as the starting value for controlling the preconduction current ("Elektronik" Magazine, 22/85, p.91). The control has the special task of maintaining the maximum and minimum optical output power constant during laser operation.

To measure the optical power emitted by the laser, it is further customary, similarly to U.S. Pat. No. 4,344,173, to integrate a monitor diode into the housing of a laser diode, which produces a cut-off current in direct proportion to the optical laser output. However, the coupling ratio between laser diode and monitor diode, and thus the proportionality factor between optical power and monitor current as well, is subjected to strong specimen scatter.

For that reason, the preconduction current control of a laser diode must be adjusted before the first startup, so that the control circuit can actually capture the emitted optical power. The control takes place in the known manner, either in accordance with the optical output during laser diode operation with preconduction current, where the optical power without modulation current is adjusted to a specific value, or in accordance with the mean value of the optical output power, which occurs with continuous modulation, while the cut-off current produced in the monitor diode by the specified optical power is compared to a reference value ("Elektronik" Magazine, 22/85, p.91-92).

However, these known methods require a control to function accurately, because the proportionality factor between the optical power and monitor current is not known.

DISCLOSURE OF INVENTION

It is therefore the task of the invention to avoid this known disadvantage, and to provide an adjustment that makes a self-adjusting preconduction current control of a laser diode possible.

Although U.S. Pat. No. 4,344,173 also uses a control circuit for adjusting the preconduction current of a laser diode, which consists of a power source, a band-pass filter and a zero crossing detector, a harmonic analysis is performed in this installation, which is very costly.

The invention fulfills the task in that the laser diode operates with a linear current ramp signal provided by the supply unit, in that the output signal of the monitor diode is differentiated three times, and in that, when the zero crossing detector recognizes a zero crossing in the thrice differentiated monitor diode output signal, it keeps the optimum power of the current ramp signal generator.

It is an advantage that, when the laser diode operates with a linear current ramp signal, its output power, as a function of time, is identical to the output power that depends on the injection current. This makes it possible for the laser preconduction current to be automatically adjusted for the optimum value, which is present during the zero crossing of the third derivative of the laser output according to the current, which corresponds to the third derivative of the optical output according to the time of laser operation with a linear ramp signal. The operating point of the preconduction current is thereby adjusted to the value at which the third derivative passes through zero, which characterizes an extreme value, in this case a maximum, of the bend of the output curve.

Another configuration of the invention can provide for the optimum intensity of the current to be retained after a period of delay.

Such a delay time can be of advantage for the optimum preconduction current, since the values that were experienced can show that a higher percentage value is better suited, depending on the type of laser diode.

The invention also fulfills the above indicated task by means of an installation that performs the above mentioned process with an adder, for superimposing the preconduction current and a modulation current, and a controllable power source that supplies the preconduction current, as well as an evaluation circuit connected to the monitor diode, which is characterized in that a known ramp signal generator controls the controllable power source that drives the laser diode, by means of a linear ramp signal, and that the evaluation circuit contains a circuit that differentiates the output signal of the monitor diode three times, and is connected by a comparator that determines the zero crossing of the triple-differentiated monitor diode output signal, to a control unit that controls the ramp signal generator or a circuit that causes the optimum preconduction current to be stored at the point in the ramp corresponding to the time when the zero-crossing takes place (or after a selected delay).

Another characteristic of the invention is that a switch may be located between the ramp signal generator and the controllable power source, which is connected to the latter and is controlled by the control unit.

This permits the laser preconduction current to be interrupted during a modulation pause, perhaps for reasons of economy, without losing the optimum value of the laser preconduction current that is stored in the ramp generator, while both the ramp generator and the switch are controlled by the control unit.

Another characteristic of the invention is that the evaluation circuit contains three series-connected, essentially known active filters, whose comparator is connected downstream.

In this way, the differentiation of the monitor diode's output signal can be performed in a simple manner, since the active filters function in the specified frequency range like a cascade of three differentiators.

It is advantageous to use band-pass filters of the first order as the three active filters.

These and other objects, features and advantages of the present invention will become more apparent in light of the following detailed description of a best mode embodiment thereof, as illustrated in the accompanying drawing.

BEST MODE FOR CARRYING OUT THE INVENTION

Figure 1:
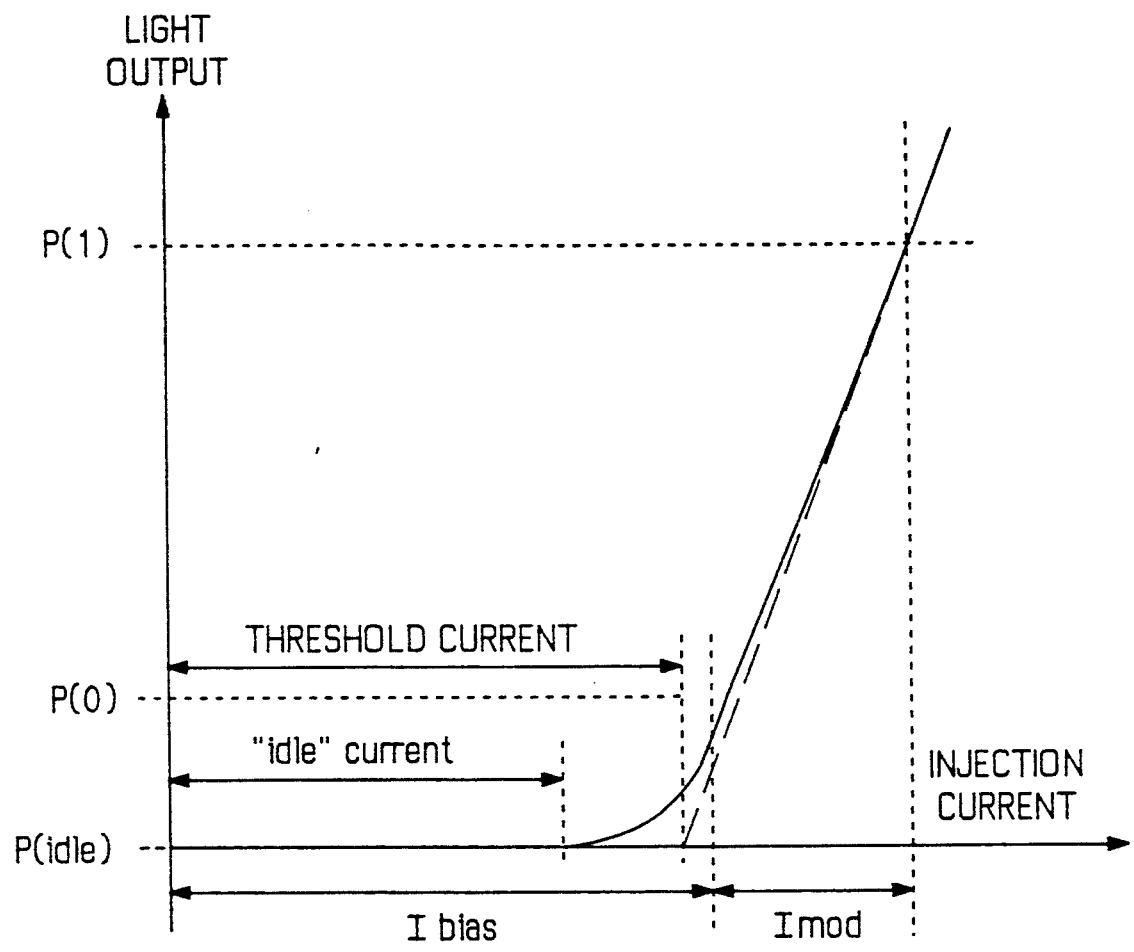
FIG. 1 shows a static laser curve according to the state of the art.

FIG. 1 shows a curve of the optical power output of a laser diode, known in the state of the art, which is a function of the injection current, and has a kink whose position may change as a function of temperature as well as of age. The kink is located in the area of the threshold current, which undergoes specimen scatter and fluctuations due to temperature and age. The shape of the curve corresponds to a hyperbola, the kink of the curve is located at the point of maximum bend.

The diagram also shows the amounts of the preconduction current $I_{bias}$, and its modulation current $I_{mod}$. The preconduction current is slightly above the threshold current whose fluctuation is compensated by a control circuit.

The control of the preconduction current of a laser diode is particularly described with a passive optical network.

Figure 2:
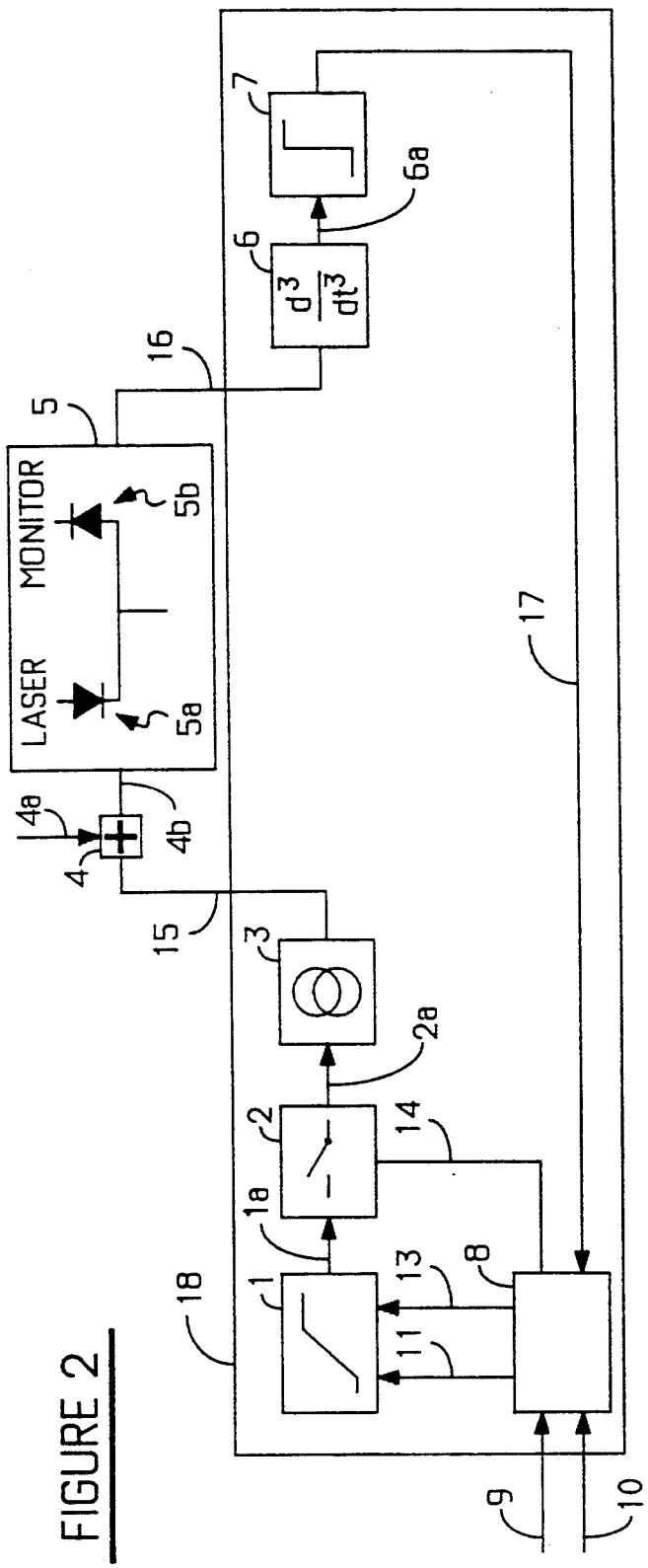
FIG. 2 is a block circuit diagram of the installation according to the invention for controlling the preconduction current of a laser diode.

FIG. 2 is a block circuit diagram of a complete laser preconduction current control 18. The laser diode 5a, which interacts with the monitor diode 5b in a unit 5, is operated with continuously increasing current from a controllable power source 3, which is controlled by a linear ramp signal from a ramp signal generator 1, which, from the time it starts, produces a signal that constantly increases from zero, over time. Because of this circuit, the optical output corresponds as a function of time, to the optical output as a function of the injection current. A controlled switch 2 is located between the ramp generator 1 and the controllable power source 3, which can interrupt a laser preconduction current ($I_{bias}$) on a line 15. The value of the laser preconduction current, stored in the ramp generator, remains. A modulation current ($I_{mod}$) on a line 4a is added to the preconduction current ($I_{bias}$) in an adder 4.

An output signal on a line 16 emanating from the monitor diode 5b is routed to an evaluation circuit 6, where it is differentiated three times, and the resulting signal on a line 6a is routed to an input of a downstream comparator 7, which sends a control signal on a line 17 to a control unit 8, when a zero crossing takes place. This control unit 8 controls both the ramp generator 1 and the switch 2, and causes the preconduction current to be turned off when a blanking signal is present on a line 9. An external signal on a line 10 causes the start of a new measuring ramp. The reset in conjunction with the simultaneous starting signal of the ramp signal generator 1 takes place through a signal generated by control unit 8 on a line 11, the stopping and thereby the retaining of the momentary value of the ramp signal current is caused by a signal on a line 13, which is also provided by the control unit.

At the start of the measurement, with the switch 2 closed, the ramp generator 1 is reset and restarted by the signal on line 11. A signal on a line 1a from ramp signal generator 1, which increases from zero, is provided on a line 2a by the controlled switch 2 and controls the power source 3, which also produces an increasing preconduction current on the line 15 for driving the laser diode 5a. The monitor diode 5b converts the optical output of laser diode 5a into an output signal on the line 16 that is differentiated three times in evaluation circuit 6. The resulting signal on the line 6a is routed to the input of comparator 7, which sends the output signal on the line 17 when the signal at its input passes through zero. When this output signal is present, the control unit 8 provides a stop-signal on the line 13, after an adjustable time delay, which achieves the holding and storing of the momentary value of the ramp signal. This determines the optimum value of the preconduction current for a control run, and the power source 3 retains this value until the end of the next run-through. Storing the ramp signal prevents this value from being lost when switch 2 is opened by the blanking signal on the line 9. This takes place, for example, to preserve the laser diode in a state preconduction greater than the threshold when no data are transmitted at the moment.

It should be realized that the functions of the various start and stop signals, blanking signals and switches may be carried out by various hardware embodiments that could dispense with or add to these signals and devices. For instance a sample-and-hold circuit could serve as part of the switch 2 to save the optimum value provided on the line 2a. In that case, the sample-and-hold circuit's output on a line 2a would always represent the latest optimum value as "captured" from the ramp generator by the action of the zero-crossing detector alone in conjunction with a control circuit such as the control 8.

The laser threshold current can be determined without previous alignment, since the position of the maximum bend of a laser diode's optical output curve, and therefore also approximately the position of the zero passage of the third derivative, is independent of constant amplification factors, and the laser diode is driven by a linear current ramp signal. The ideal preconduction current is always higher than the threshold current by the same amount, and can therefore be determined from the laser preconduction current control 18, without any return signal.

Figure 3:
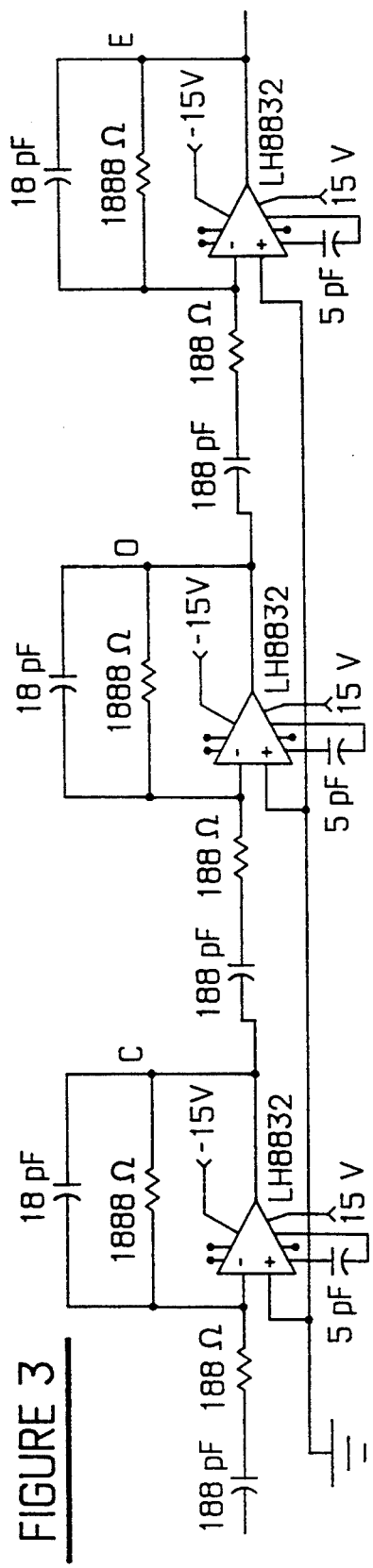
FIG. 3 is a configuration example of the evaluation circuit according to the invention.

FIG. 3 shows a configuration example of the evaluation circuit 6 of three series-connected, first order bandpass filters, which perform the differentiation of the signal 16, and to which the comparator 7 of FIG. 2 is connected. The amplification is limited to the value of 10 per step, to advantageously reduce the tendency of the circuit to oscillate. To be able to utilize the active filters as linear phase differentiators, the edge frequency of the filters must be situated above the highest significant spectrum line of the input signal on the line 16. The derivatives of the input signal 16 are obtained from the nodes marked C, D, E.

Figure 4:
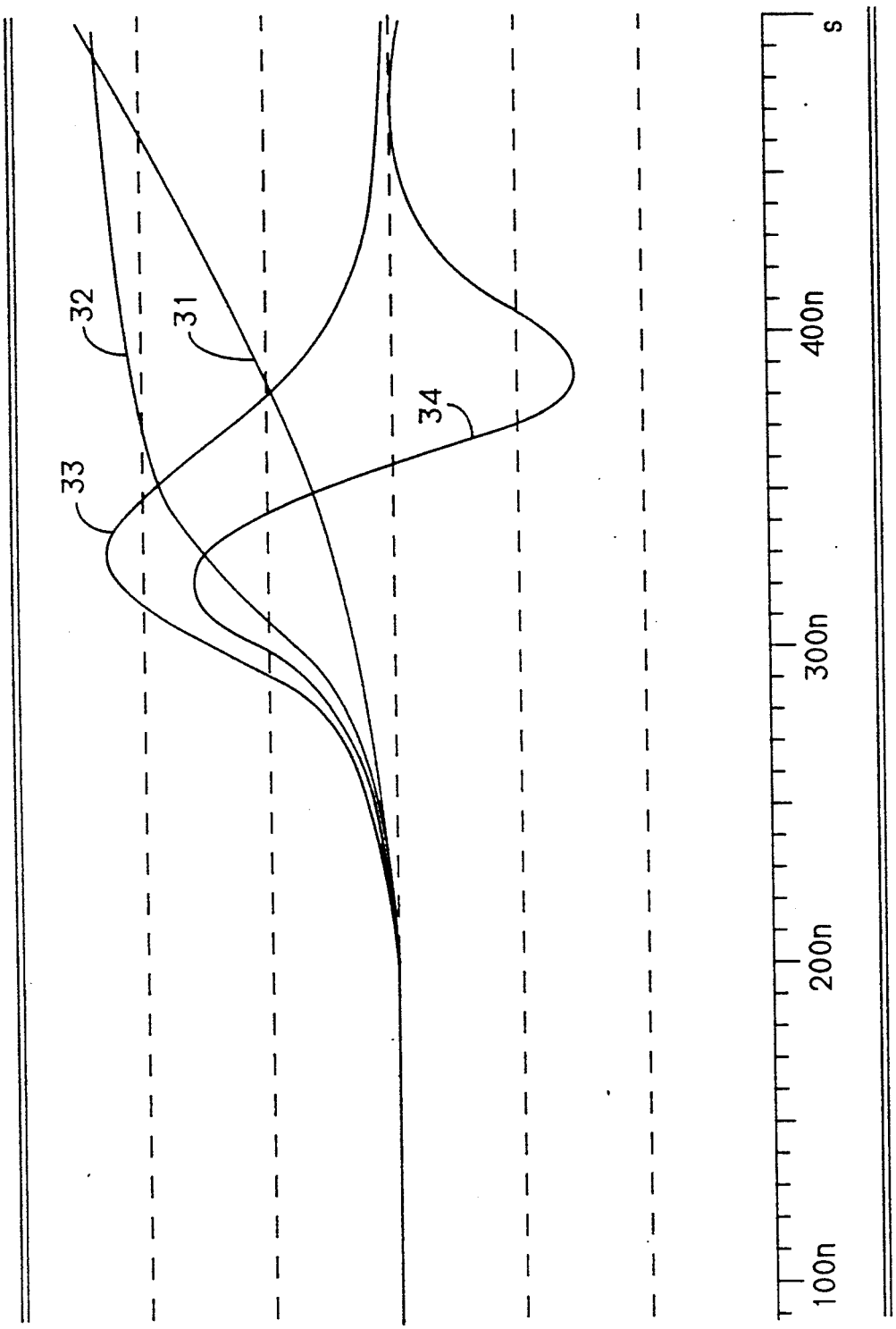
FIG. 4 is a diagram of the signals in the evaluation circuit of FIG. 3.

FIG. 4 depicts the signal processes taking place in the evaluation circuit 6 during the differentiation process. A curve 31 corresponds to the input signal on the line 16, which is identical to the laser output curve. The illustrated curves 32, 33 and 34 correspond to the first, second and third derivatives, respectively, of the input signal on the line 16, and were obtained from the nodes marked C, D, E in FIG. 3.

A negligible dependency of the zero passage of the third derivative 34 of input signal 16 was shown, and a small effect of noise on the signal.

The preconduction current must be adjusted on a regular basis, since the laser chip undergoes temperature variations during which the laser cannot be modulated. It is therefore recommended to provide a suitable time window in the network log for the control process, during which time no data are transmitted.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

What is claimed is:

1. A process for adjusting a preconduction current of a laser diode that operates in conjunction with a monitor diode in a control circuit with operational amplifiers, comprising signal processing filters, a power supply unit, and a zero passage detector, wherein the laser diode (5a) is driven by a linear current ramp signal provided by the power supply unit, that the output signal (16) of the monitor diode (5b) is differentiated three times, and that a selected current of a current ramp signal generator is retained when a zero passage of the triple-differentiated monitor diode output signal (16) is detected wherein the current ramp signal generator provides an output signal that controls the linear current ramp signal provided by the power supply unit.

2. A process as in claim 1, the selected current is retained after a period of delay.

3. Apparatus for adjusting a preconduction current of a laser diode that operates in conjunction with a monitor diode and having an adder for superimposing the preconduction current and a modulation current, a controllable power source that provides the preconduction current, as well as an evaluation circuit that is connected to the monitor diode, further comprising:

a ramp signal generator (21) for controlling the controllable power source (23), the power source for providing a linear ramp signal to drive the laser diode (5a), and that the evaluation circuit (6) contains a circuit for differentiating an output signal (16) of the monitor diode (5b) three times, for providing a thrice differentiated signal to a comparator (7) for providing a control signal to a control unit (8) for controlling the ramp signal generator (21), wherein the comparator detects a zero crossing of the thrice differentiated monitor diode output signal.

4. The apparatus of claim 3, wherein a switch (22) is located between the ramp signal generator (21) and the controllable power source (23), which is connected thereto and can be controlled by control unit (8).

5. An installation as in claim 3, wherein the evaluation circuit (6) contains three series-connected active filters, while the comparator (7) is connected downstream of the filters.

6. An installation as in claim 5, wherein the three active filters are band-pass filters of the first order.

7. Apparatus, comprising:

a laser diode (5a), responsive to an excitation signal (4b), for providing a light output;

a monitor (5b), responsive to the light output, for providing a sensed light output signal (1b);

a triple differentiator (6), responsive to the sensed light output signal (16), for providing a thrice differentiated signal (6a);

a zero-crossing detector (7), responsive to the thrice differentiated signal, for providing a zero-crossing signal (17);

a control unit (8), responsive to a start signal (10), the zero-crossing signal (17), and a blanking signal (9), for providing a ramp signal generator starting signal (11), a ramp signal generator stopping signal (13), and a switch control signal (14);

a ramp generator (1), responsive to the starting signal (11) and to the stopping signal (13), for providing a ramp output signal (1a);

a switch (2), responsive to the ramp output signal (1a) and to the switch control signal (14), for providing a switched ramp output signal (2a);

a power source (3), responsive to the switched ramp output signal (2a), for providing a preconduction current signal (15); and a summer (4), responsive to the preconduction current signal (15) and to a modulation signal (4a), for providing the excitation signal (4b).

8. The apparatus of claim 7, wherein the stopping signal (13) is provided in response to the zero-crossing signal (17) after a time delay.

9. The apparatus of claim 8, wherein the time delay is adjustable.

* * * * *